United States Patent [19]
Van Roosmalen

[11] Patent Number: 5,844,301
[45] Date of Patent: Dec. 1, 1998

[54] BALANCED INTEGRATED SEMICONDUCTOR DEVICE OPERATING WITH A PARALLEL RESONATOR CIRCUIT

[75] Inventor: Marcel Wilhelm Rudolf Martin Van Roosmalen, Hengelo, Netherlands

[73] Assignee: Telefonaktiebolaget LM Ericsson, Stockholm, Sweden

[21] Appl. No.: 787,527

[22] Filed: Jan. 21, 1997

[30] Foreign Application Priority Data

Jan. 22, 1996 [EP]  European Pat. Off. .............. 96200152

[51] Int. Cl.⁶ .................................................... H01L 29/00
[52] U.S. Cl. .......................... 257/532; 257/535; 257/798
[58] Field of Search ................................. 257/532, 535, 257/665, 728, 798, 924; 327/548

[56] References Cited

U.S. PATENT DOCUMENTS 3,963,996  6/1976  Skerlos ................................. 331/117 R
5,266,821  11/1993  Chern et al. ............................ 257/312

FOREIGN PATENT DOCUMENTS 382948   8/1990   European Pat. Off. .
417668   3/1991   European Pat. Off. .
61-270909 12/1986  Japan .
5-47992  2/1993   Japan ...................................... 257/532

*Primary Examiner*—Olik Chaudhuri
*Assistant Examiner*—Nathan K. Kelley
*Attorney, Agent, or Firm*—Burns, Doane, Swecker & Mathis, L.L.P.

[57] ABSTRACT

A balanced frequency responsive circuit comprising circuit components formed in a semiconductor chip having first and second on-chip contact terminals which connect to first and second off-chip contact terminals, respectively, and a balanced parallel resonator circuit coupled to the contact terminals. The resonator circuit comprises a capacitance portion and an inductance portion. Part of the capacitance portion is on-chip connected between the first and second on-chip contact terminals. Another part of the capacitance portion and the inductance portion are off-chip series connected between the first and second off-chip contact terminals such that the contact terminals are comprised in a single resonant loop, essentially producing no spurious resonance signals.

11 Claims, 6 Drawing Sheets

BALANCED INTEGRATED SEMICONDUCTOR DEVICE OPERATING WITH A PARALLEL RESONATOR CIRCUIT

FIELD OF THE INVENTION

The present invention relates generally to integrated semiconductor devices and, more specifically, to integrated semiconductor devices comprising circuit components forming an on-chip balanced frequency responsive circuit, such as a balanced oscillator circuit, arranged to operate with an off-chip parallel resonator circuit. The frequency responsive circuit may form part of a larger integrated circuit such as an RF transceiver, modulator or mixer circuit.

BACKGROUND OF THE INVENTION

Integrated frequency responsive circuits of the type according to the present invention typically make use of external or off-chip balanced resonator circuits to introduce resonance into the circuit. A well known example is formed by a balanced oscillator circuit the active portion of which is provided as an on-chip integrated semiconductor circuit while an off-chip passive resonator portion connects to the active portion through one or more contact terminals of the chip package for completing the oscillator circuit.

At present wireless telecommunication systems, for example, are designed to operate in the Super High Frequency (SHF) band or lower microwave band, i.e. frequencies up to 10 GHz or even higher. Integrated Circuits (IC's) as commonly used, mounted on a lead frame with contact terminals or contact pins, bonding pads and bonding wires and encapsulated, show at these high frequencies intrinsic capacitances and inductances of the contact terminals, the bonding pads, the bonding wires and the lead frame.

Those skilled in the art will appreciate that, at such high frequencies, when coupling an off-chip resonator circuit to an on-chip frequency responsive circuit as described above, the intrinsic capacitances and inductances will have a substantial influence on the frequency response of the circuit as a whole. In the case of a balanced parallel resonator circuit the result is not only a detuning of the resonance frequency of the circuit and a change in impedance but also a creation of unwanted spurious resonance frequencies. Accordingly, an oscillator circuit, for example, using the resonance provided by a balanced off-chip parallel resonator circuit can produce undesired output signals at various spurious resonance frequencies.

SUMMARY OF THE INVENTION

For RF design, balanced frequency responsive circuits are generally preferred because of there relative high common mode rejection ratio, virtually no unwanted RF radiation through uncontrolled return paths to signal ground and the absence of ground bouncing, i.e. lifting of the ground potential of the entire circuit.

It is an object of the present invention to provide a balanced frequency responsive circuit comprising circuit components formed in a semiconductor chip, for example as part of a larger integrated circuit, operating with a balanced parallel resonator circuit and avoiding as much as possible spurious resonance frequencies caused by intrinsic capacitances and inductances involved with the chip packaging.

It is a further object of the invention to provide an integrated semiconductor device comprising circuit components forming at least part of a balanced frequency responsive circuit to be operated with an off-chip balanced parallel resonator portion for forming a frequency responsive circuit having as less as possible spurious resonance frequencies caused by intrinsic capacitances and inductances associated with the packaging of the semiconductor circuit.

It is in particular an object of the present invention to provide a frequency responsive circuit comprising a balanced oscillator circuit.

According to the present invention, there is provided a balanced frequency responsive circuit comprising circuit components formed in a semiconductor chip having first and second on-chip contact terminals which connect to first and second off-chip contact terminals, respectively. A balanced parallel resonator circuit is coupled to the contact terminals and comprises a capacitance portion and an inductance portion. Following the invention, part of the capacitance portion of the resonator circuit is on-chip connected between the first and second on-chip terminals, whereas another part of the capacitance portion and the inductance portion are off-chip series connected between the first and second off-chip terminals. Such that with the on-chip connected part of the capacitance portion a parallel resonator circuit is formed comprising the contact terminals in a single resonant loop.

By the positioning, according to the invention, of part of the capacitance portion of the parallel resonator circuit at the chip between the on-chip contact terminals, the intrinsic package capacitances are electrically incorporated with the on-chip resonator part while the intrinsic inductances are electrically incorporated with the off-chip series connected part of the capacitance portion and the inductance portion of the resonant circuit to form a single resonant loop. Hence, the frequency responsive circuit inhibits essentially a single resonance frequency.

The invention is based on the insight that by incorporating the package, i.e. its intrinsic capacitances and inductances, as an integral part of the resonator circuit the influence of the electrical parameters of the package on the frequency responsive performance of the circuit as a whole can be essentially minimized.

In a preferred embodiment of the invention, a first part of the off-chip connected capacitance portion and a first part of the inductance portion are series connected between the first off-chip contact terminal and signal ground of the circuit. A second part of the off-chip connected capacitance portion and a second part of the inductance portion are series connected between the second off-chip contact terminal and signal ground of the circuit. These series connections having electrically symmetrical configurations.

With this embodiment, by providing variable off-chip connected capacitance portions, the resonance frequency of the resonance circuit and hence its impedance can be accurately adjusted to match the impedance of the on-chip part of the frequency responsive circuit.

The on-chip connected capacitance portion of the resonator circuit may be formed by a separate capacitor mounted on the semiconductor substrate. However, while miniaturization of equipment is a standing requirement, according to another embodiment of the invention, the on-chip connected resonator portion may comprise a capacitance integrally formed with the semiconductor substrate. Producing such integrated capacitances is well known in the art of semiconductor devices.

Those skilled in the art will appreciate that the off-chip resonator portions may comprise separate, conventional passive capacitors and coils as well as semiconductor integrated capacitances and inductances, the latter either electronically generated or physically formed in the semiconductor chip, such as known in the art of manufacturing semiconductor devices.

The invention further relates to an integrated semiconductor device comprising circuit components formed in a semiconductor chip. The circuit components are arranged to comprise at least part of a frequency responsive circuit having first and second on-chip contact terminals which connect to first and second off-chip contact terminals, respectively. For use of the semiconductor device as a frequency responsive circuit, a balanced parallel resonator circuit comprising a capacitance portion and an inductance portion has to be connected to the contact terminals. However, following the invention, part of the capacitance portion of the resonator circuit is already on-chip connected between the first and second on-chip contact terminals of the semiconductor device.

In a particular embodiment of the invention, the circuit components are arranged to provide a so-called balanced oscillator circuit.

The frequency responsive circuit according to the present invention may form part of a larger integrated circuit, such as a transceiver circuit having a mixer or modulator circuit coupled to a frequency responsive circuit formed as a Local Oscillator (LO), following the well known heterodyning principle. Reference is made to the book "Communication Systems" by A. Bruce Carlson, McGraw-Hill, 2nd-edition, Chapter 5.

The above-mentioned and other features and advantageous of the invention are illustrated in the following description with reference to the enclosed drawings.

DETAILED DESCRIPTION OF THE EMBODIMENTS

Figure 1:
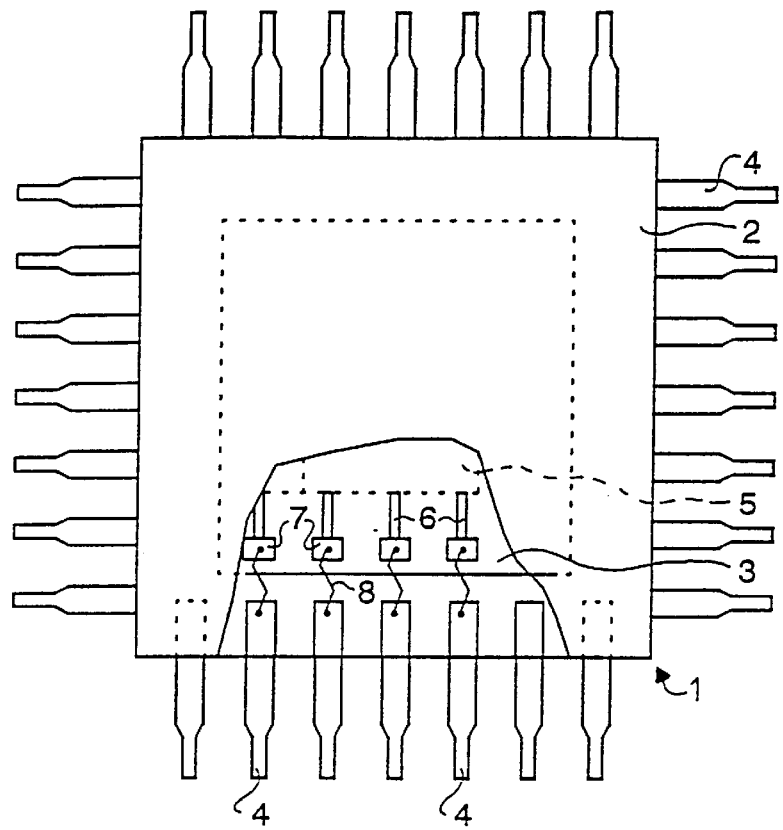
FIG. 1 is a schematic top view of a typical prior art large scale integrated circuit the package of which is shown partly broken away for illustration purposes.

Without the intention of a limitation, the invention will now be described and illustrated with reference to an exemplary embodiment. In the drawings, like circuit elements and features are designated by like reference symbols.

FIG. 1 shows a typical prior art large scale integrated circuit device 1, having a plastic package 2 which encapsulates a semiconductor integrated circuit substrate or chip 3 and a plurality of contact terminals 4 having the form of contact strips for surface mount or contact pins for through hole connection on a printed circuit board (PCB), for example. For illustration purposes, the package 2 is shown in a partly broken view.

The chip 3 comprises, among others, a frequency responsive circuit 5 which is illustrated with broken lines. A plurality of electrically conductive tracks 6 connect the circuit 5 to contact or bonding pads 7 positioned alongside the chip 3. To couple signals and power between off-chip circuitry and on-chip circuitry, the on-chip contact terminals or bonding pads 7 connect through bonding wires 8 to the off-chip contact terminals 4, as shown.

Figure 2:
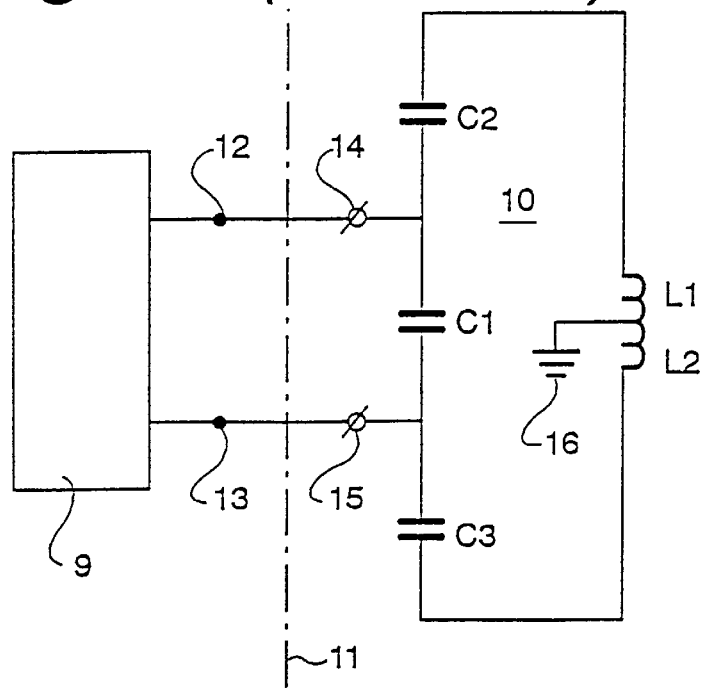
FIG. 2 is a circuit diagram of a typical prior art connection of an integrated or on-chip balanced frequency responsive circuit and an external or off-chip resonator circuit.

FIG. 2 shows a typical circuit diagram connection of an integrated or on-chip balanced frequency responsive circuit 9 and an external or off-chip balanced resonator circuit 10. The dashed-dotted line 11 illustrates the interface between the on-chip and the off-chip circuitry, respectively. The frequency responsive circuit 9, which is schematically indicated by a block, may comprise any of a plurality of balanced electrical circuits requiring an additional resonator circuit to operate, such as but not limited to balanced RF oscillators, balanced frequency converters, balanced RF mixers circuits, balanced filter circuits etc.

In the context of the present invention, the term "balanced" has to be construed as comprising a system or network having two signal contact terminals presenting certain equal or symmetrical electrical characteristics to signal ground of the system or network such as impedance and signal magnitude, for example.

The on-chip part of the frequency responsive circuit 9 comprises first and second on-chip signal contact terminals 12 and 13 which connect to first and second off-chip contact terminals 14 and 15, respectively. With reference to FIG. 1, the on-chip contact terminals may be comprised of the bonding pads 7 and the off-chip contact terminals may be comprised of the contact terminals 4.

The resonator circuit 10 has a capacitance portion comprising a capacitance C1, connected between the off-chip contact terminals 14 and 15, and capacitances C2 and C3. The capacitances C2 and C3 connect with one end to one of the off-chip contact terminals 14 and 15, respectively, and connect with another end to an inductance portion of the resonator circuit. This inductance portion comprises a series connection of inductances L1 and L2 which in turn are series connected with the capacitances C2 and C3. The series connection centre point of L1 and L2 connects to signal ground 16 of the circuit, such as shown. In the present drawings, signal ground 16 is illustrated with three short bold printed parallel lines. The capacitance and inductance portion form a balanced parallel resonator circuit 10.

In the case of a balanced oscillator circuit 9, for example, when operating at its oscillation frequency, the impedance centres of the resonator or tank circuit 10 are at signal ground potential and the signal output voltages between either contact terminal 14, 15 and its centre are equal in magnitude and opposite in phase.

As described in the introductory part to this specification, a problem with encapsulated integrated circuits, in particular for RF applications, is formed by intrinsic capacitances and inductances associated with the encapsulation or package of the chip and the coupling of the internal and external circuitry through both on-chip and off-chip contact terminals.

Figure 3:
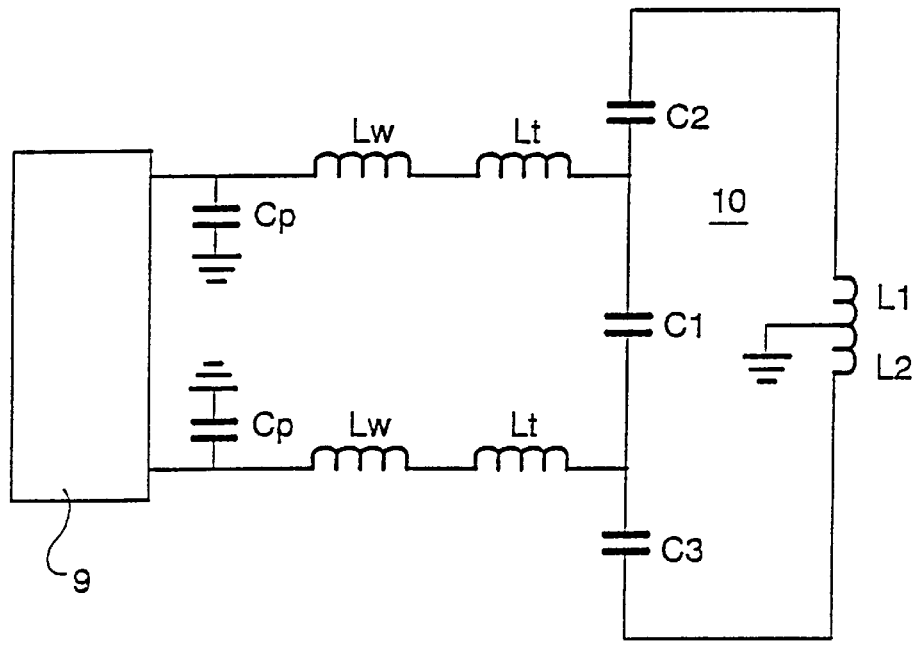
FIG. 3 is a lumped element equivalent electric circuit diagram of the circuit shown in FIG. 2.

FIG. 3 is a simplified lumped element equivalent electric circuit diagram of the circuit shown in FIG. 2. Capacitances Cp, which connect between the on-chip contact terminals and signal ground, respectively, represent the parasitic capacitance formed by the on-chip bonding pads 7 (FIG. 1). Inductances Lw represent the parasitic self inductance of the bonding wires 8 (FIG. 1), whereas the inductances Lt represent the parasitic self inductance of the lead frame and the contact terminals 4 (FIG. 1) of the package. The inductances Lw and Lt are series connected between the on-chip part of the frequency responsive circuit 9 and the off-chip connected resonator circuit 10, as shown.

Any ohmic resistance associated with the bonding pads, the bonding wires and the contact terminals, as well as the parasitic capacitances and inductances associated with the mounting of the IC on a PCB are not material to the understanding of the present invention, and hence not explicitly shown in the lumped equivalent circuit diagram.

Figure 4:
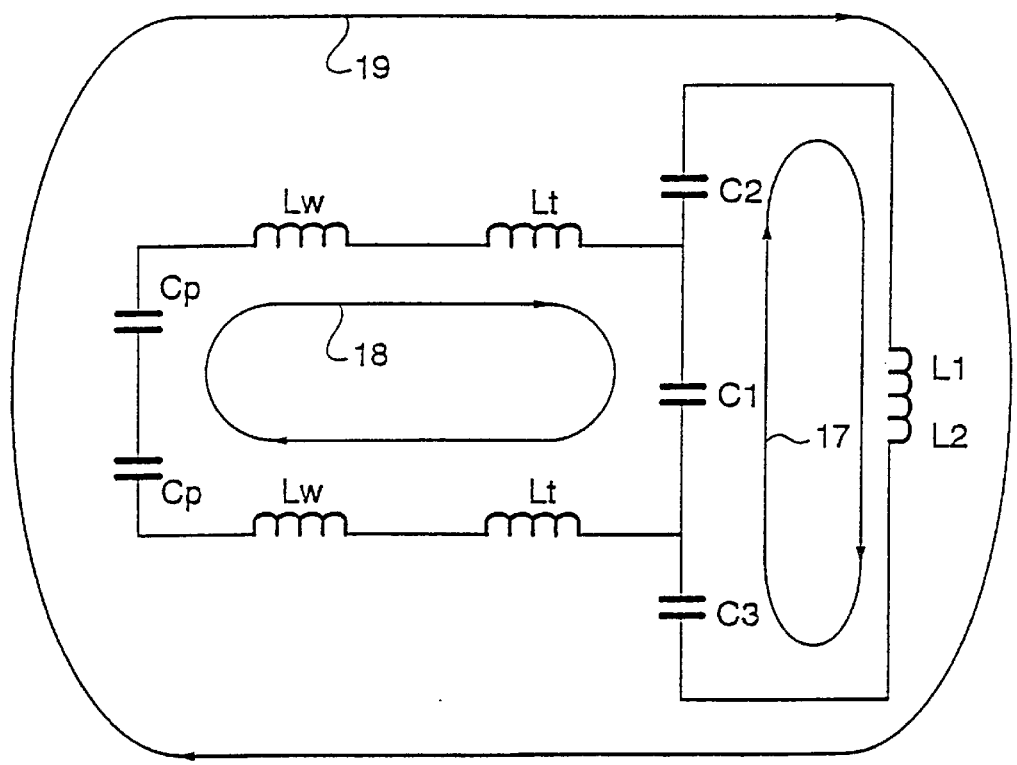
FIG. 4 illustrates several resonant loops which can be distinguished in the circuit diagram shown in FIG. 3.

Viewed from the on-chip frequency responsive circuit 9, three different resonant loops 17, 18 and 19 can be distinguished, as illustratively shown in FIG. 4. Resonant loop 17 is formed by the resonant circuit 10, i.e. the capacitances C1, C2 and C3 and the inductances L1 and L2. Resonant loop 18 is comprised of the capacitances Cp and C1 and the inductances Lw and Lt. Resonant loop 19 comprises the capacitances Cp, C2 and C3 and the inductances Lw, Lt, L1 and L2. It will be understood that resonant loop 17 represents the desired frequency response of the circuit, whereas the loops 18 and 19 are formed due to the intrinsic packaging capacitances and inductances. The resonance introduced by the loops 18 and 19 may produce—in general at RF applications—undesired output signals at spurious resonance frequencies. Accordingly, when starting up a frequency responsive circuit 9 designed as an oscillator circuit, it is not guaranteed at which frequency the resonator will operate.

Figure 5:
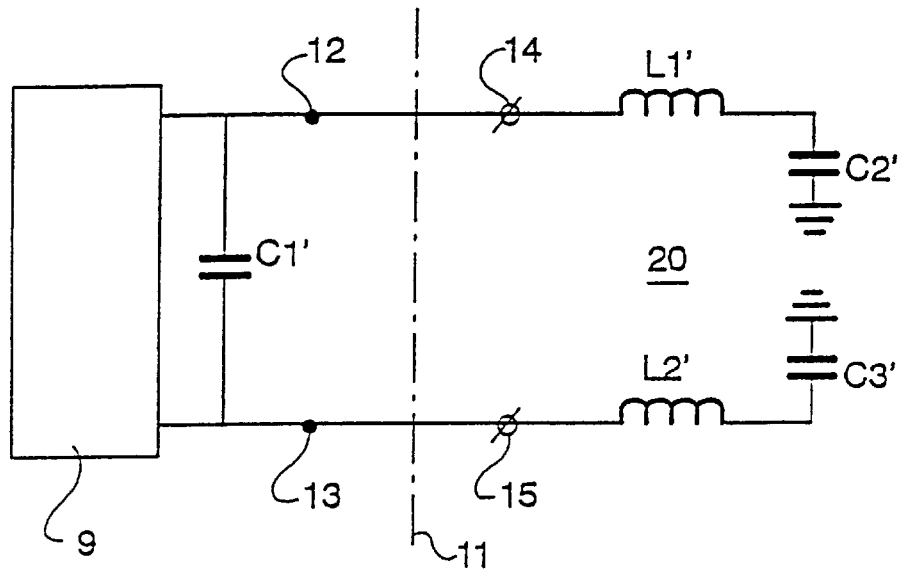
FIG. 5 is a circuit diagram according to the present invention of an integrated or on-chip balanced frequency responsive circuit and an external or off-chip resonator circuit.

FIG. 5 shows a typical circuit diagram connection of a preferred embodiment of the present invention, comprising an integrated or on-chip balanced frequency responsive circuit 9 and a balanced resonator circuit 20, comprising a capacitance portion C1', C2' and C3' and an inductance portion L1' and L2'. The dashed-dotted line 11 again indicates the interface between the on-chip and the off-chip circuitry, respectively.

Different from the prior art as shown in FIG. 2, part C1' of the capacitance portion of the resonator circuit is on-chip connected between the on-chip contact terminals 12 and 13, whereas the other part C2' and C3' of the capacitance portion and the inductance portion L1', L2' of the resonator circuit are off-chip series connected between the first and second off-chip contact terminals 14, 15 and signal ground, respectively. The inductances L1', L2' and the capacitances C2' and C3' form with the on-chip capacitance C1' a balanced parallel resonator circuit 20.

Figure 6:
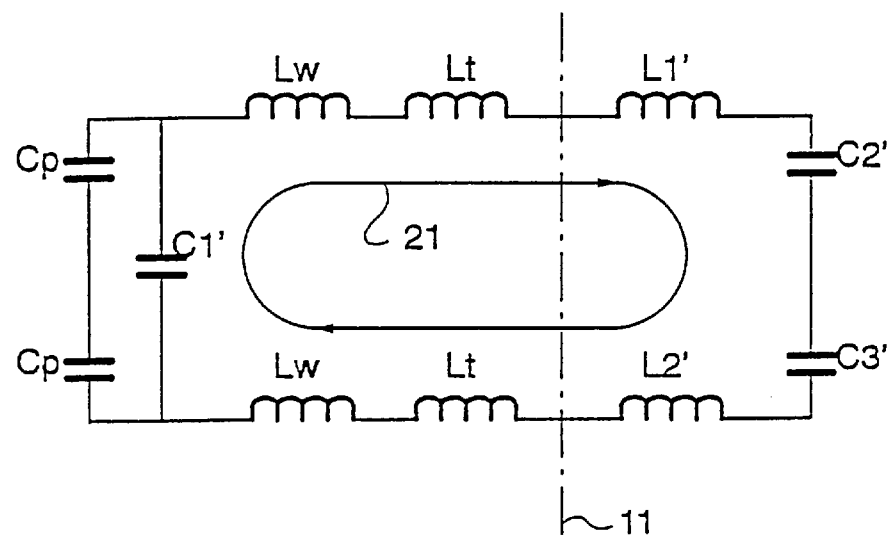
FIG. 6 is a lumped equivalent electric circuit diagram of the circuit according to the present invention shown in FIG. 5.

FIG. 6 shows a resonant loop diagram for the circuit according to the invention as shown in FIG. 5. The intrinsic capacitances Cp form an electric series connection which is electrically parallel connected to the on-chip capacitance portion C1' of the resonator circuit 20. Following ohms law and assuming equal lumped equivalent capacitances Cp the total on-chip capacitance can be electrically substituted by a single lumped capacitance value equal to the sum of the capacitance values of C1' and Cp. The intrinsic inductances Lw and Lt are series connected with the off-chip part of the resonator circuit 20, i.e. the inductances L1' and L2' and the capacitances C2' and C3'. According to ohms law, the lumped equivalent inductances Lw and Lt and the inductances L1' and L2' may be substituted by single inductances having an inductance value equal to the sum of the values of Lw, Lt and L1', respectively Lw, Lt and L2'.

As illustrated in FIG. 6, in the embodiment according to the present invention just a single resonant loop 21 can be distinguished. Accordingly, compared to the prior art circuitry as shown in FIG. 4, the frequency responsive circuit 9 will essentially operate at a single resonance frequency without producing undesired output signals at spurious resonance frequencies, following the object of the present invention.

For illustration purposes, in an embodiment the present invention operates with capacitance values of C1'=1 pF, C2'=C3'=4.7 Pf and inductance values of L1'=L2'=3 nH. At a resonance frequency of about 2 GHz the value of Cp equals about 0.2 pF and the value of Lw is about 1 nH and Lt equals about 1.5 nH. By those skilled in the art it will be appreciated that, for design purposes, the relevant intrinsic capacitance and inductance values have to be taken into account when calculating the component values of the off-chip resonator circuit 20 in order to achieve an intended or desired frequency response of the circuit as a whole.

Figure 7A:
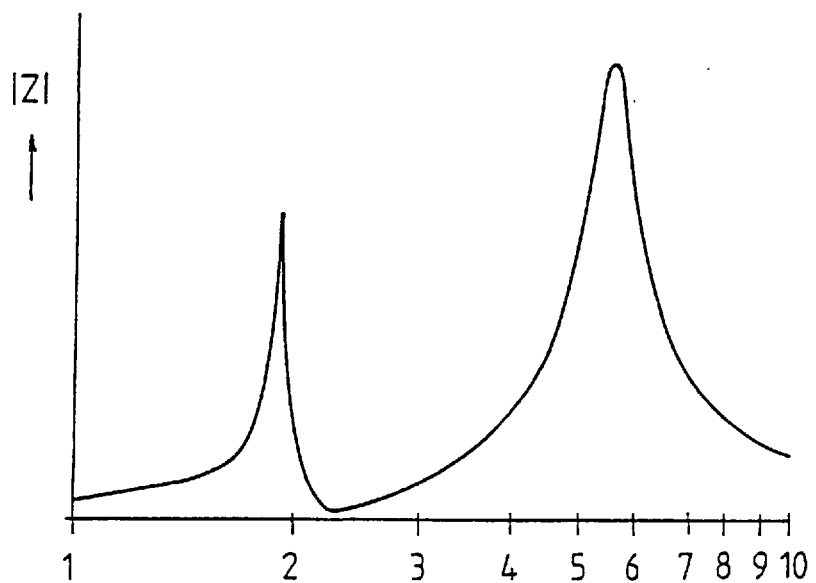
FIGS. 7a and 7b are graphs of the impedance measured at the on-chip bonding pads of the circuits according to FIGS. 2 and 5, respectively, as a function of the frequency.
Figure 7B:
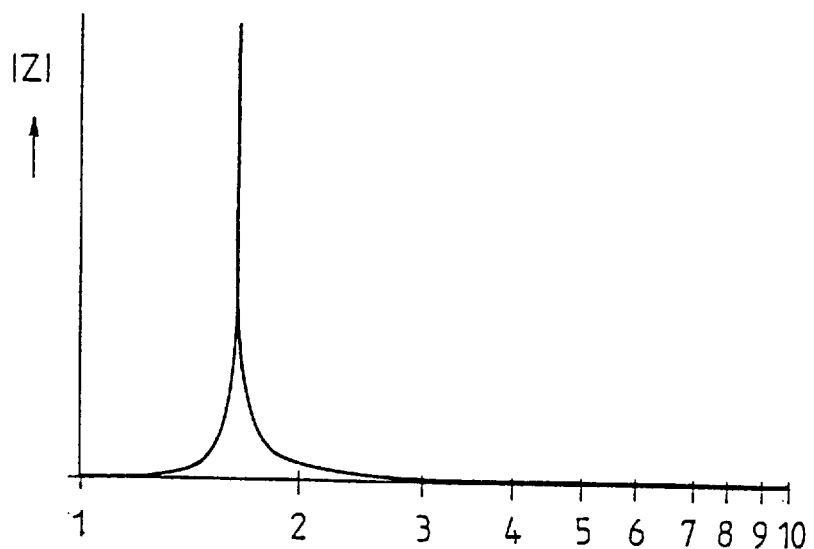

FIG. 7a is a simulated graph of the magnitude of the impedance Z versus frequency f of the prior art lumped equivalent resonator circuit shown in FIG. 4, whereas FIG. 7b is a simulated and by measurements confirmed graph of the magnitude of the impedance Z, i.e. |Z|, versus frequency f of the lumped equivalent resonator circuit according to the invention shown in FIG. 6. The impedance Z of the circuits refers to the value at the on-chip contact terminals and the values of the circuit elements are substantially as indicated above. The frequency f is depicted on a logarithmic scale ranging from 1 to 10 GHz. Because of their illustrative nature, in both graphs no impedance values are indicated.

The prior art graph of FIG. 7a shows, besides the desired primary parallel resonance (high impedance value) of loop 17 (FIG. 4) at a frequency of about 2 GHz, also an undesired secondary parallel resonance at frequency of about 6 GHz, essentially caused by loop 18 (FIG. 4). In case of an oscillator circuit, for example, this may cause a spurious output signal at the frequency of about 6 GHz. Those skilled in the art will appreciate the problems associated with such spurious output resonance signals.

However, following the present invention, over the frequency range of 1 to 10 GHz, just a single resonance action at the desired primary frequency of about 2 GHz occurs, which provides the circuit of the invention an extremely important advantage over the prior art circuitry.

Figure 8:
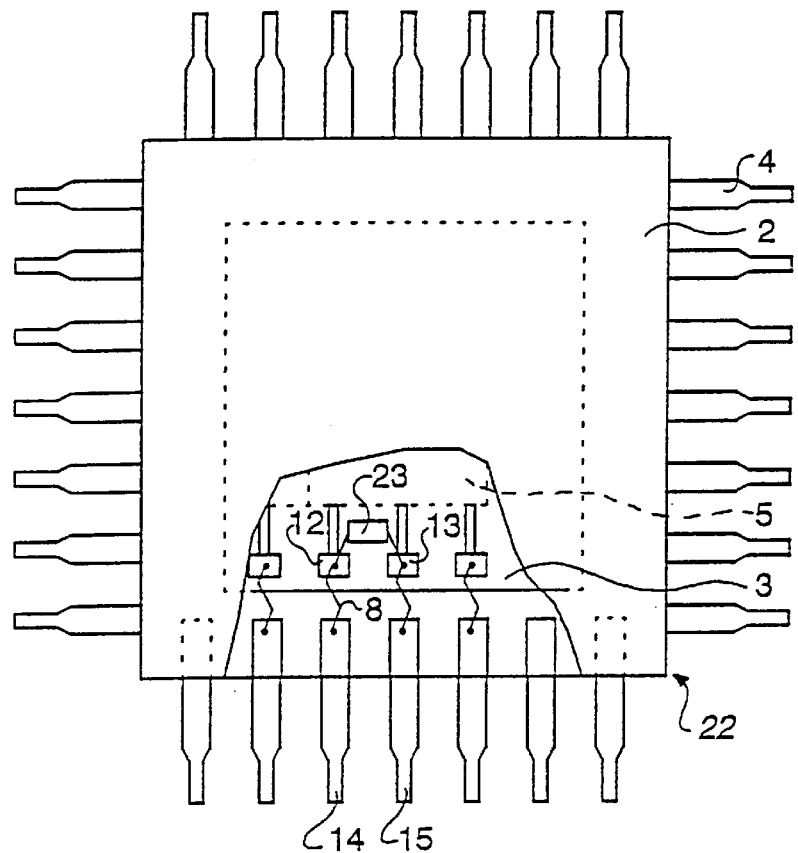
FIG. 8 is a schematic top view of an integrated circuit device according to the present invention, the package of which is shown partly broken away for illustration purposes.

FIG. 8 is a schematic top view of an integrated circuit device 22 according to the present invention, the package 2 of which is shown partly broken for illustration purposes. As schematically illustrated, following the invention a separate capacitor 23 is arranged at the chip 3 and is electrically connected between the on-chip contact terminals 12 and 13 of the on-chip part of the frequency responsive circuit 5. The circuit 5 connects through bonding wires 8 to the off-chip contact terminals 14 and 15, respectively.

Alternatively to a separate capacitor 23, a capacitance integrally formed with the chip 3 i.e. its semiconductor substrate may be used.

Figure 9:
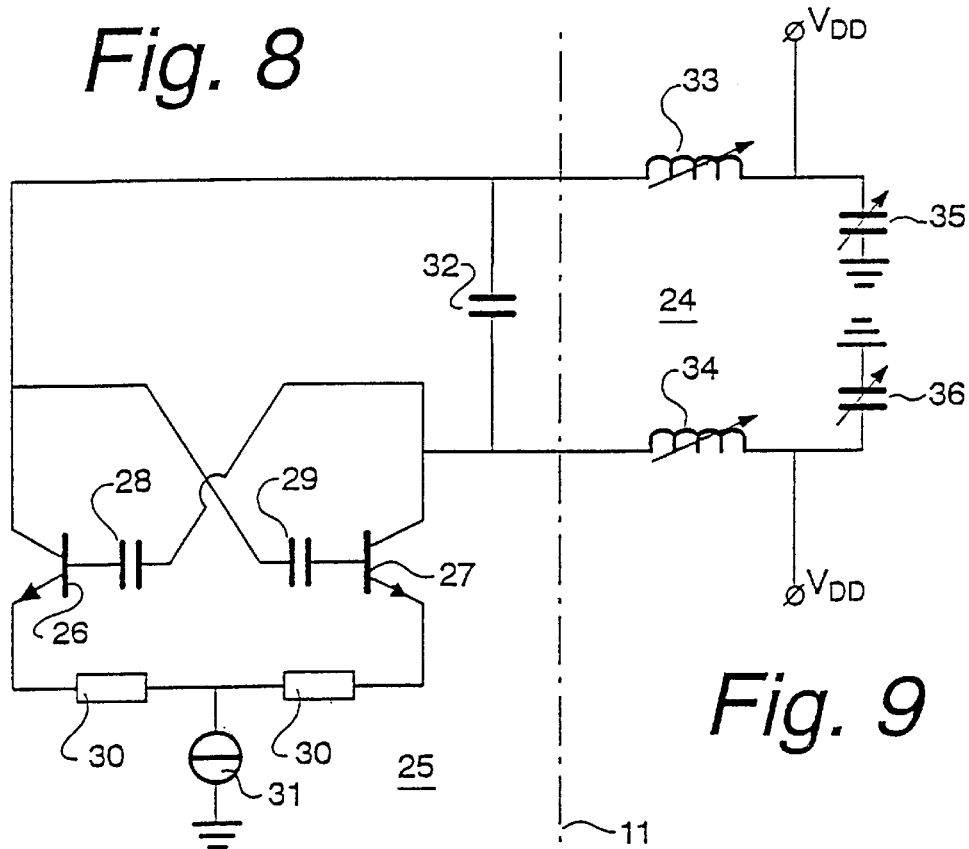
FIG. 9 is an electric circuit diagram of an oscillator circuit according to the present invention.

FIG. 9 shows a schematic circuit diagram of an on-chip balanced oscillator circuit 25 coupled with an off-chip balanced resonator circuit 24 according to the present invention. The dashed-dotted line 11 indicates the interface between the on-chip and off-chip parts. The active oscillator part comprises two bipolar NPN transistors 26, 27. Transistor 26 connects with its base terminal through a capacitor 28 to the collector terminal of transistor 27. The base terminal of transistor 27 connects through a capacitor 29 to the collector terminal of transistor 26. Each of the emitter terminals of transistors 26 and 27 connect through a series resistor 30 to one end of a constant current source 31, another end of which connects to signal ground of the circuit. Essentially, the active oscillator part consists of a balanced transadmittance amplifier with positive feedback having a passive balanced parallel resonator circuit coupled between the collector terminals of the transadmittance stage.

Following the present invention, a capacitor 32 is on-chip connected between the collector terminals of transistors 26 and 27, which in turn connect through inductances 33 and 34 to power terminals $V_{DD}$ of the circuit. Capacitors 35 and 36, connected between $V_{DD}$ and signal ground, respectively, complete the resonator circuit 24 as shown. Both the inductances 33, 34 and the capacitors 35, 36 may be of a variable type, such to provide a tunable balanced oscillator circuit.

During start-up the transadmittance amplifier operates in its linear region and provides excessive negative resistance between the collector terminals causing an increase of signal amplitude. The current through the resonator circuit 24 is, however, limited by the constant current source 31. During steady state oscillation, at which the frequency of the output signal is guaranteed and defined according to the present invention, the loop gain equals unity and the negative resistance introduced by the transadmittance stage equals the opposite of the parallel resistance of the resonator circuit.

In an embodiment, emitter resistors 30 having a value of 125 ohm and positive feedback capacitors 28 and 29 both having a value of 1 pF have been used. The current source 31 has been formed by three NPN transistors connected in a known manner to provide a constant current source (not shown). The capacitors 35 and 36 of the resonator circuit 24 have been provided by so-called varicaps, i.e. voltage controlled tunable capacitors, such as the Siemens BBY51-03W. The inductances 33 and 34 have been etched on the PCB to provide a degree of freedom to tune the resonator circuit on the PCB. With these varicaps, a Voltage Controlled Oscillator (VCO) circuit has been provided.

Those skilled in the art will appreciate that the active part of the oscillator circuit 25 can also be realized using PNP bipolar transistors, MOS-transistors etc. accompanied by the obvious modifications in view of the powering of the circuit.

It will be appreciated that the off-chip resonator portions may comprise separate, conventional passive capacitors and induction coils as well as semiconductor integrated capacitors and other devices showing capacitive action and transmission devices of the strip-line type or other inductors, either in a passive fashion or electronically generated. Further, the several capacitors and inductors of the off-chip resonator circuit may itself be comprised of networks of capacitors and inductors, however maintaining the inventive single resonant loop concept according to the present invention.

Further, it will be appreciated that by connecting an external resonator circuit arranged to comprise several resonance frequencies to an on-chip frequency responsive device according to the present invention, the inventive single resonant loop concept as described and claimed refers to each of the separate resonant loops of the resonator circuit.

Figure 10:
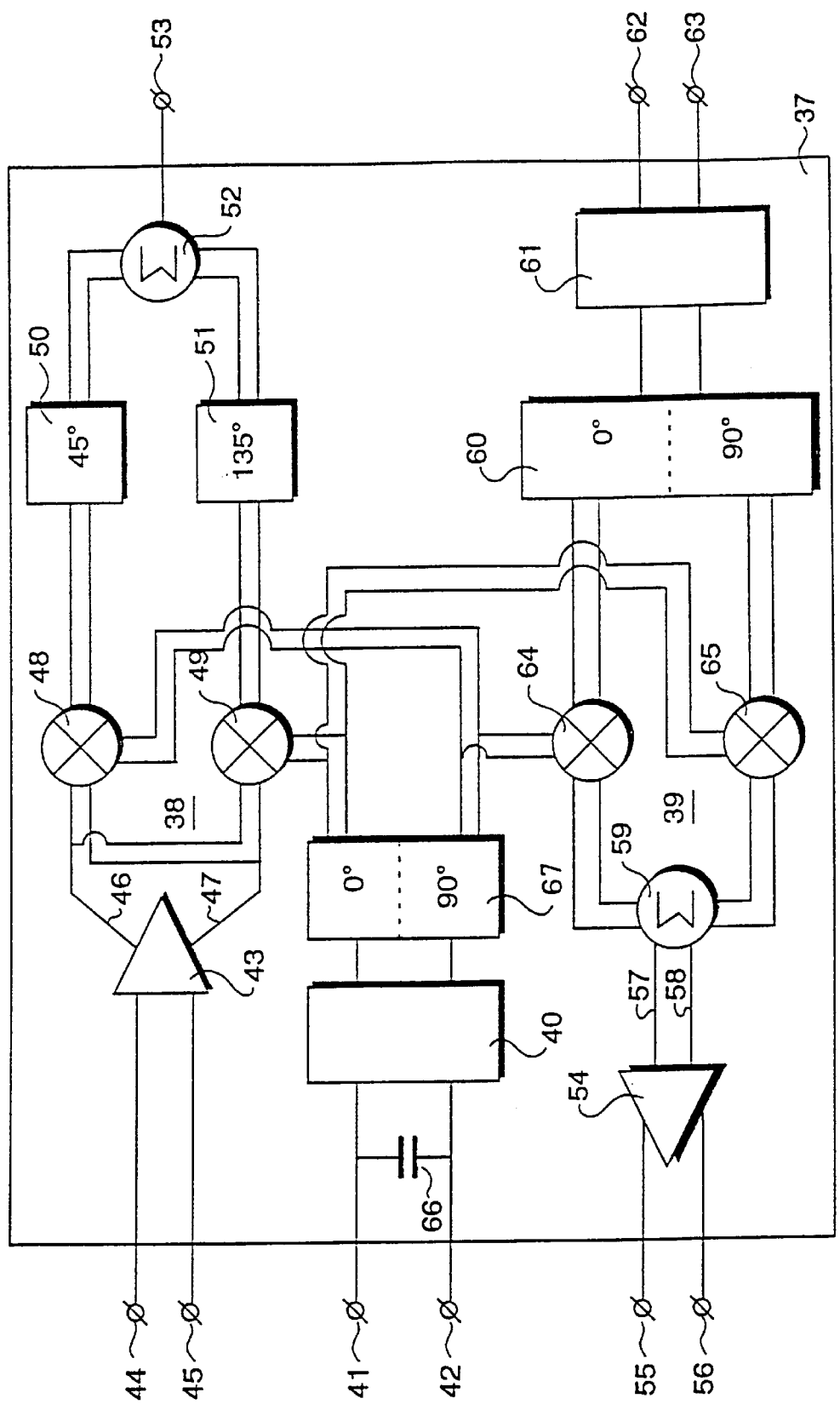
FIG. 10 is a block diagram of an integrated semiconductor transceiver device comprising an oscillator circuit according to the present invention.

FIG. 10 shows a typical application of balanced oscillator circuit according to the invention in a transceiver semiconductor device 37. The device 37 is a so-called Application Specific Integrated Circuit (ASIC) and comprises a balanced receiver part 38, a balanced transmitter part 39 and a balanced oscillator circuit 40.

The receiver part 38 comprises a balanced low noise input amplifier 43 having signal input terminals 44, 45 and signal output terminals 46, 47 which connect to an input of a quadrature network comprising two balanced mixers 48 and 49 the outputs of which connect to a balanced phase shifter 50, 51, respectively. The outputs of the phase shifters 50, 51 are fed to a summation circuit 52, to provide a received output signal at an output terminal 53 of the circuit 37.

The transmitter part 39 comprises a balanced output amplifier 54, having output terminals 55 and 56 and input terminals 57 and 58 which connect to the output of a balanced summation circuit 59. The transmitter part 39 further comprises a quadrature network consisting of a balanced phase shifter 60, the input of which connects to an Intermediate Frequency (IF) VCO circuit 61, having input terminals 62, 63 for receiving a modulator output signal to be transmitted. The outputs of the phase shifter 60 connect to an input of balanced mixers 64 and 65, respectively. The output signals of the mixers are fed to inputs of the summation circuit 59.

The transceiver device 37 operates following the well known heterodyning principle, requiring a Local Oscillator (LO) signal. The LO signal is provided by the oscillator circuit 40. As schematically indicated by a capacitor 66, according to the present invention, part of the capacitance portion of an off-chip resonator circuit to be connected to contact terminals 41, 42 of the oscillator circuit 40 is already positioned at the semiconductor substrate of the device 37.

The oscillator circuit 40 connects with its outputs to a balanced phase shifter 67, the outputs of which connect to respective inputs of the mixers 48, 49 and 64, 65, as shown.

In an embodiment the device 37 has been designed as a transceiver for use with a radio base station and/or a remote radio communication terminal, such as a radio telephone handset operating according to the Digital Enhanced Cordless Telecommunications (DECT) standard. The oscillator 40 operates as a VCO at a centre frequency of 1.8 GHz.

I claim:

1. A balanced frequency responsive circuit comprising circuit components formed in a semiconductor chip having first and second on-chip contact terminals which connect to first and second off-chip contact terminals, respectively, and a balanced resonator circuit coupled to said first and second on-chip contact terminals and said first and second off-chip contact terminals, said resonator circuit comprises a capacitance portion and an inductance portion, wherein part of said capacitance portion is on-chip connected between said first and second on-chip contact terminals, and another part of said capacitance portion and said inductance portion are off-chip series connected between said first and second off-chip contact terminals, such that said on-chip and off-chip connected resonator portions form a balanced parallel resonator circuit comprising said first and second on-chip contact terminals and said first and second off-chip contact terminals in a single resonant loop.

2. A frequency responsive circuit according to claim 1, wherein a first part of said off-chip connected capacitance portion and a first part of said inductance portion are series connected between said first off-chip contact terminal and signal ground of the circuit, and wherein a second part of said off-chip connected capacitance portion and a second part of said inductance portion are series connected between said second off-chip contact terminal and signal ground of the circuit.

3. A frequency responsive circuit according to claim 1, wherein said off-chip connected portions comprise a variable capacitance part.

4. A frequency responsive circuit according to claim 1, wherein said off-chip connected portions comprise an inductance part.

5. A frequency responsive circuit according to claim 1, wherein said on-chip connected capacitance portion comprises a capacitance integrally formed with said semiconductor chip.

6. A frequency responsive circuit according to claim 1, wherein said integrated circuit components are arranged to comprise a balanced oscillator circuit.

7. An integrated semiconductor device, comprising circuit components formed in a semiconductor chip, said circuit components forming at least part of a frequency responsive circuit having first and second on-chip contact terminals which connect to first and second off-chip contact terminals, respectively, for connecting a balanced resonator circuit which comprises a capacitance portion and an inductance portion, wherein part of said capacitance portion of said resonator circuit is on-chip connected between said first and second on-chip contact terminals, such that by off-chip series connection between said first and second off-chip contact terminals of another part of said capacitance portion and said inductance portion a balanced parallel resonator circuit is formed comprising said first and second on-chip contact terminals and said first and second off-chip contact terminals in a single resonant loop.

8. An integrated semiconductor device according to claim 7, wherein said on-chip connected capacitance portion comprises a capacitance integrally formed with said semiconductor chip.

9. An integrated semiconductor device according to claim 7, wherein said integrated circuit components are arranged to comprise a balanced oscillator circuit.

10. An integrated semiconductor device according to claim 7, wherein said oscillator circuit comprises a first and second bipolar transistor of an equal conductivity type, having emitter terminals which connect by a series resistance to an integrated current source circuit and capacitively cross-coupled collector and base terminals, and wherein said collector terminals connect to said first and second on-chip contact terminals, respectively.

11. An integrated semiconductor device according to claim 7, wherein said integrated circuit components are arranged to form a transceiver circuit having a mixer circuit coupled to said oscillator circuit, which oscillator circuit forming a local oscillator circuit to said mixer circuit.

* * * * *